US009078346B2

(12) United States Patent
Naumovski

(10) Patent No.: US 9,078,346 B2
(45) Date of Patent: Jul. 7, 2015

(54) INSULATOR PROTECTION

(71) Applicant: Varian Semiconductor Equipment Associates, Inc., Gloucester, MA (US)

(72) Inventor: Oliver V. Naumovski, Peabody, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 149 days.

(21) Appl. No.: 13/793,776

(22) Filed: Mar. 11, 2013

(65) Prior Publication Data

US 2014/0251677 A1 Sep. 11, 2014

(51) Int. Cl.
*H05K 5/02* (2006.01)
*H01B 3/00* (2006.01)

(52) U.S. Cl.
CPC .. *H05K 5/02* (2013.01); *H01B 3/00* (2013.01); *Y10T 29/4973* (2015.01)

(58) Field of Classification Search
CPC ........... H05K 13/00; H05K 5/02; H01B 3/00; H01B 17/26; H01B 17/30; H01B 17/301; Y10T 29/4973
USPC ........... 174/50, 520, 539, 546, 540, 541, 565, 174/59, 650, 262, 135, 152 G, 153 G, 152 R, 174/137 R, 142, 138, 149 R, 11 BH, 12 BH, 174/14 BH; 16/2.1, 2.2; 248/56
See application file for complete search history.

(56) References Cited

U.S. PATENT DOCUMENTS

| | | | | |
|---|---|---|---|---|
| 4,774,385 | A * | 9/1988 | Toshima | 174/142 |
| 5,466,891 | A * | 11/1995 | Freeman et al. | 174/142 |
| 7,262,367 | B2 * | 8/2007 | Donzel et al. | 174/142 |
| 7,276,665 | B1 * | 10/2007 | Rauckman | 174/135 |
| 7,939,752 | B2 * | 5/2011 | Sjoberg et al. | 174/142 |
| 7,964,799 | B2 * | 6/2011 | Isberg et al. | 174/142 |
| 8,088,996 | B2 * | 1/2012 | Tornkvist et al. | 174/142 |
| 8,471,150 | B2 * | 6/2013 | Emilsson et al. | 174/142 |

* cited by examiner

*Primary Examiner* — Angel R Estrada

(57) ABSTRACT

Insulating materials disposed within the housing are protected through the use of removable protective layers, which can be fit over the insulating components. In some embodiments, these removable protective layers are dimensioned so as to fit over the insulating components without the use of any fasteners. In other embodiments, a fastener, such as a set screw or clip, may be used to hold the removable protective layer in place. These removable protective layers can be placed over any insulating component in a housing, such as a high voltage feed through insulator. During preventative maintenance cycles, the coated removable protective layer is removed from the insulating component, and a new protective layer is used to cover the insulating component.

18 Claims, 4 Drawing Sheets

INSULATOR PROTECTION

Embodiments of the present invention relate to methods and apparatus for protecting insulators, particularly insulators within housings.

BACKGROUND

Semiconductor workpieces are processed within ion implantation systems. Ion implantation system may comprise an ion source, extraction electrodes, a mass analyzer, a collimating magnet, one or more deceleration stages and a process chamber. Throughout this disclosure, the term "housing" is used to refer to any chamber or other enclosure through which an ion beam passes. Thus, the housings include the deceleration stages, the mass analyzer, the collimating magnet and the process chamber. It is common for components disposed within these housings, such as the interior walls, electrodes, insulators and other equipment to show signs of contamination or become coated. This may be due to the deposition of ions or other materials on these components. In addition, the ions may tend to etch or corrode any material which is in the path of the ions, causing the flaking or sputtering of particulate. Some of this particulate may be deposited on the components in the housings. For example, components, such as bushings, cables, electrodes, lenses, and interior walls may become coated. These coating may become deleterious. For example, a coating may be more conductive than the underlaying component, thereby creating a conductive path where none previously existed.

Therefore, after a period of ion implantation system operation, this coating becomes deleterious, and must be removed. This is a common practice in this field and these coatings may be removed during a process known as a preventative maintenance (or "PM") cycle. During the preventative maintenance cycle, each component may be cleaned in order to remove the coating. This process may be quite time consuming, as each component must be cleaned. This may result in unacceptable periods of time where the housings are inactive, which results in reduced throughput. In addition, the materials used to clean these components may be harsh, such that the underlying component is damaged by the cleaning material. Therefore, repeated exposure to these cleaning materials may also degrade the integrity of the component and lead to the need for component replacement.

In an attempt to minimize these periods of time and extend component lifetimes, in some scenarios, operators may stock a plurality of some of these components. In this way, during the PM cycle, the coated component is removed from the housing, and a clean component from the stock is used to replace it. The removed coated component can then be cleaned offline without negatively affecting the operation of the ion implantation system and returned to stock. While this method reduces the time required for the preventative maintenance cycle, it does require the operator to buy and stock additional components, some of which may be quite expensive. In addition, removal of these components may be nontrivial.

Therefore, a system and method of protecting components disposed within a housing from becoming coated would be beneficial. Furthermore, a method to minimize the time and cost associated with cleaning these components would also be beneficial.

SUMMARY

Insulating materials disposed within the housings are protected through the use of removable protective layers, which can be fit over the core insulating components. In some embodiments, these removable protective layers are dimensioned so as to fit over the core insulating components without the use of any fasteners. In other embodiments, a fastener, such as a set screw or clip, may be used to hold the removable protective layer in place. These removable protective layers can be placed over any core insulating component in a housing in an ion implantation system, such as a high voltage feed through insulator. During preventative maintenance cycles, the coated removable protective layer is removed from the core insulating component, and a new protective layer is used to cover the core insulating component.

According to one embodiment, a housing is disclosed. This housing comprises a high voltage feed through insulator at least partially disposed in the housing, wherein the high voltage feed through insulator comprises a core insulating material having an outer surface; and a removable protective layer disposed on at least a portion of the outer surface of the core insulating material. In some embodiments, the removable protective layer is secured to the component using a fastener.

According to another embodiment, a method of cleaning a process chamber is disclosed. The process for cleaning a housing, containing a high voltage feed through insulator which holds an electrode, comprises removing the electrode from the high voltage feed through insulator to allow access to a removable protective layer disposed on the high voltage feed through insulator; removing the removable protective layer from the high voltage feed through insulator; replacing it with a new removable protective layer; and reinstalling the electrode into the high voltage feed through insulator.

According to a third embodiment, a housing comprises a high voltage feed through insulator at least partially disposed in the housing, wherein the high voltage feed through insulator comprises a core insulating material having an extended portion having outer walls and inner walls, wherein the inner walls define a cavity; an electrode disposed in the cavity; and a removable protective layer disposed on at least a portion of the outer and inner walls of the extended portion.

BRIEF DESCRIPTION OF THE FIGURES

For a better understanding of the present disclosure, reference is made to the accompanying drawings, which are incorporated herein by reference and in which.

DETAILED DESCRIPTION

In this disclosure, the term "housing" is used to describe various types of enclosures or chambers used with plasma deposition systems (PLAD), beam line systems, chemical vapor deposition (CVD) systems, and other similar environments. Therefore, this disclosure is not limited to any particular type of housing.

Coating caused by exposure to ions within a housing may be harmful to the core components disposed within the housing. In one embodiment, a coating applied to a conductive component, such as an electrode, may have an insulating effect, thereby reducing the electrical field emitted by the electrode. In another embodiment, a coating applied to an insulator, such as a bushing, may create a more conductive surface, thereby counteracting the insulating property of the bushing. In either case, the growth of these coatings is preferably minimized.

During PM cycles, the coatings that formed on these core components must be addressed. In accordance with one embodiment, core components within the housing are protected by a removable outer layer of protective material. In this embodiment, during normal operation, the coating that typically forms now accumulates on the removable protective layer. During PM cycles, this removable protective layer can be simply removed, discarded and replaced with another such protective layer. Furthermore, since the protective layer is preferably thin, such as less than 1/16 inches, it may be low in cost, and therefore easily stocked. In addition, its thickness may allow the protective layer to be used without any modification to existing core components or housings. Furthermore, by using a removable protective layer, the underlying core component is not exposed to the coating and therefore does not require cleaning. This also allows the core component to avoid exposure to the harsh cleaning materials and scrubbing, which tend to reduce the useful life of the core component.

Thus, the use of a removable outer layer of protective material may serve three purposes. First, it minimizes the exposure of the underlying core component to harmful ions. Second, since the core component does not become coated, it does not need to be cleaned, thereby minimizing its exposure to harsh cleaning materials and scrubbing cycles, thereby extending its useful life. Third, it reduces the time and cost associated with a PM cycle, as the protective layers are simply removed, discarded and replaced.

Figure 4A:
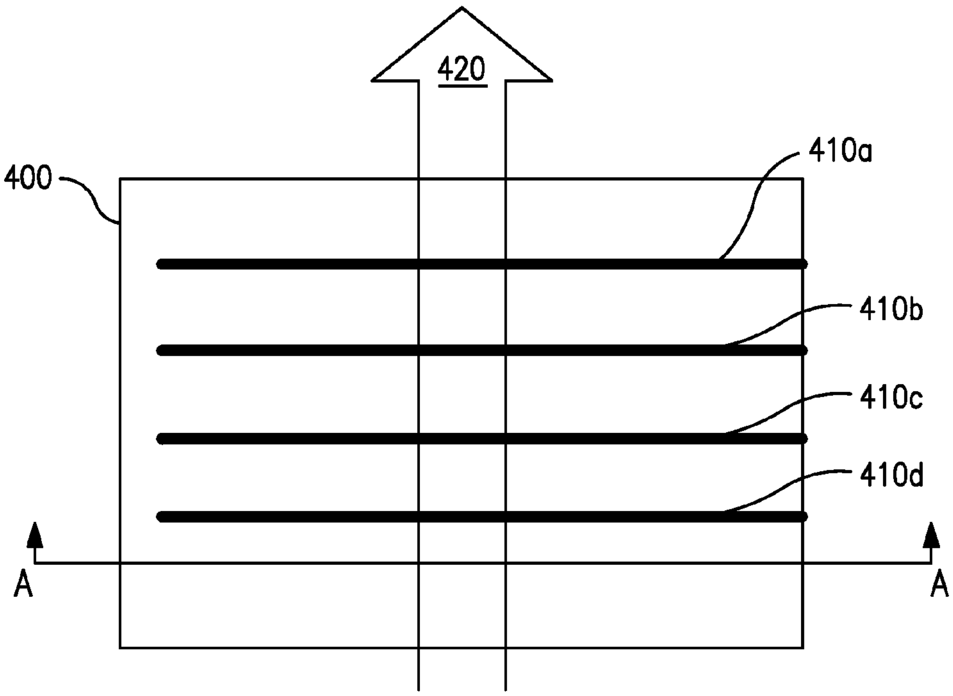
FIGS. 4A-B shows two different views of a housing where multiple electrodes may be disposed.
Figure 4B:
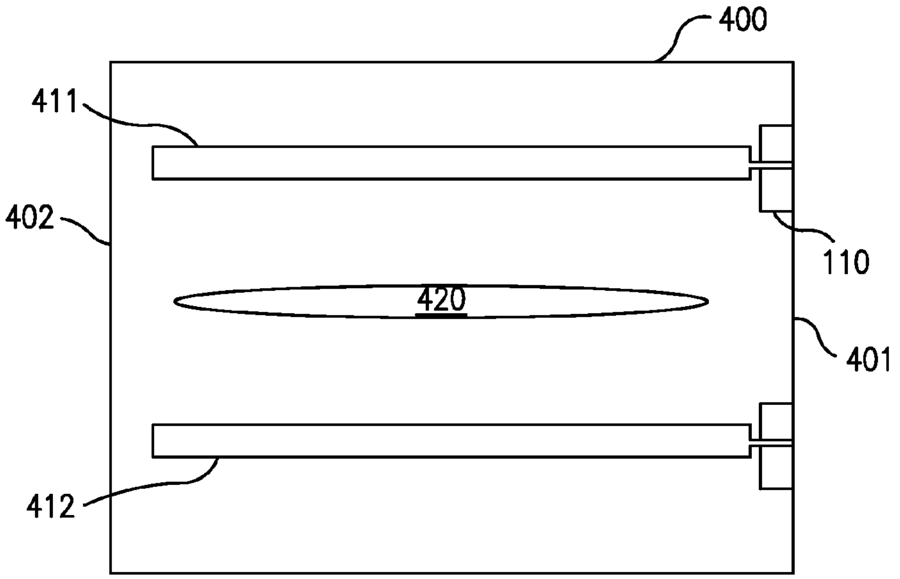

In housings, a conductive component, such as a lens or electrode, may be attached to a wall of the housing. For example, FIG. 4A shows a top view of a deceleration stage 400, which may be employed in an ion implantation system. FIG. 4B shows a cross section of the deceleration stage 400 taken along line A-A. The deceleration stage 400 may comprise a plurality of electrodes 410*a*-410*d*. While FIG. 4A shows four electrodes 410*a*-410*d*, any number of electrodes may be used. The ion beam 420 passes between these electrodes 410, and its path may be affected by these electrodes 410. For example, different voltages may be applied to each electrode to vary the trajectory and speed of the ion beam 420. FIG. 4B shows that each electrode 410*a*-410*d* in FIG. 4A may comprise a respective upper electrode 411 and a lower electrode 412, whereby the ion beam 420 passes through the gap therebetween. Each electrode 411, 412 may be biased using a power supply (not shown) disposed outside the deceleration stage 400. Electrical connection between the power supply and the electrodes 411, 412 may be achieved through a high voltage feed through insulator 110 disposed along the walls 401 of the housing. Although FIG. 4B shows the electrodes connected to high voltage feed through insulators 110 disposed on only one wall 401, the electrodes may be connected to any of the walls. For example, all upper electrodes 411 may be connected to high voltage feed through insulators 110 disposed on wall 401 while the lower electrodes 412 may be connected to high voltage feed through insulators 110 disposed on wall 402. Other configurations may also be employed.

Figure 1:
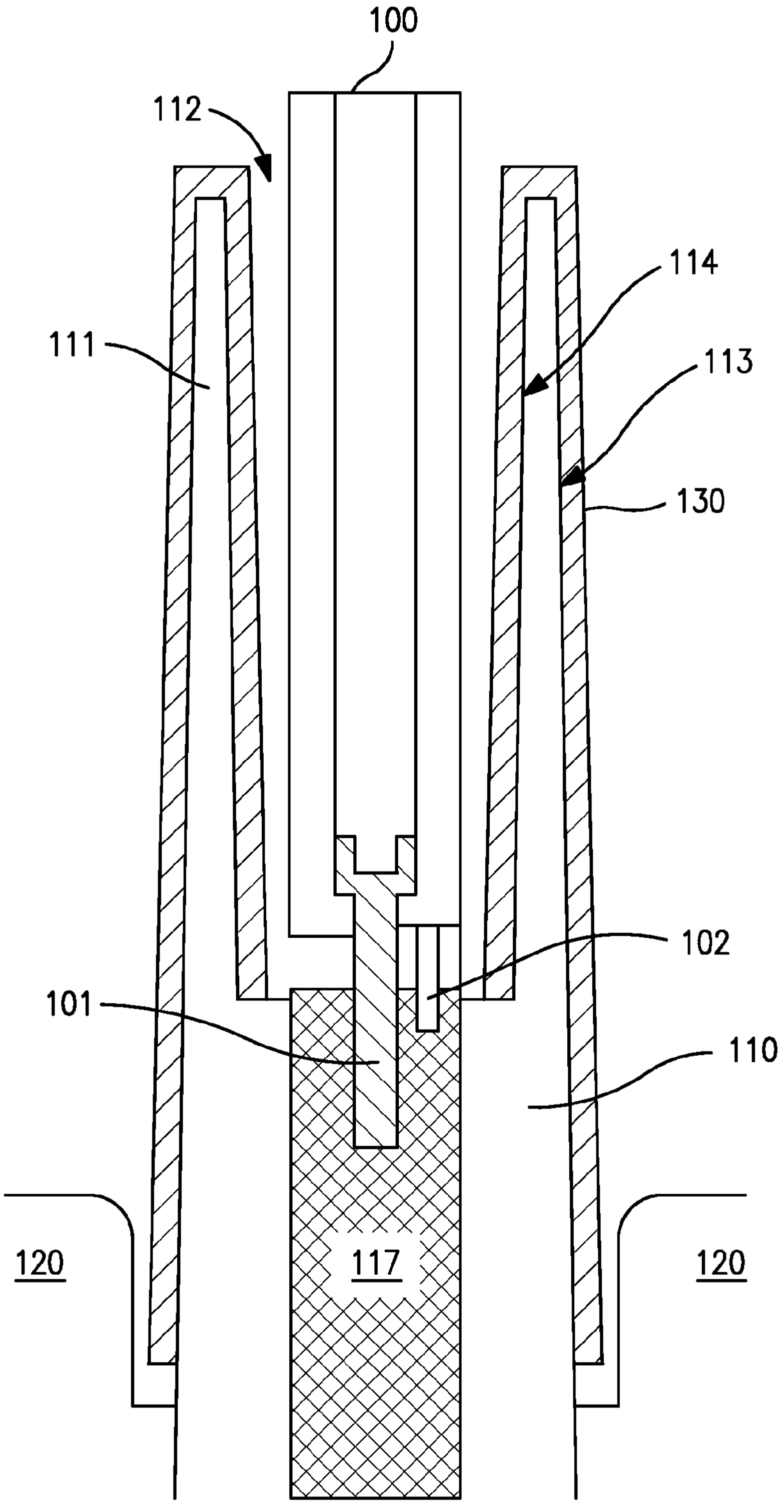
FIG. 1 shows a first component that may be protected according to one embodiment.

FIG. 1 shows a cross-sectional view of a removable protective layer 130 used in accordance with one embodiment. In this figure, an electrode 100, which may be made of graphite or some other conductive material, is held in place by a high voltage feed through insulator 110. This electrode 100 may be any of the electrodes described in FIG. 4, for example. The high voltage feed through insulator 110 may be constructed from insulating materials, such as alumina, boron nitride, Macor®, sesin epoxy and other suitable materials.

This high voltage feed through insulator 110 may have an extended portion 111. The extended portion 111 has outer walls 113 which face outward toward the housing and inner walls 114, which serve to define a cavity 112 into which the electrode 100 may be inserted. At the base of the cavity 112, there may be one or more electrical connection points 117. In this figure, the electrode 100 is shown as having protruding conductive pins 101, 102 which are inserted into the electrical connection points 117, which provide the requisite voltage to the electrode 100. However, different numbers of electrical connections are possible and the number of electrical connections is not limited by this disclosure. In addition, different electrical connection techniques may also be used.

During operation, the high voltage feed through insulator 110, and particularly the extended portion 111, serves to protect the electrical connections points 117 and the protruding conductive pins 101, 102 from bombardment from ions or from becoming coated. However, the outer walls 113 and inner walls 114 of the extended portions 111 may become coated themselves.

In one embodiment, the portion of the electrode 100 which attaches to the high voltage feed through insulator (i.e. the lower concealed portion) may have a certain shape, such as circular, elliptical or rectangular. In this case, the high voltage feed through insulator 110 may extend outward from the housing wall 120, such that, when viewed from within the housing, the insulator 110 may appear to have the same circular, elliptical or rectangular ring shape, such that the cavity 112 wraps completely around the lower concealed portion of the electrode 100. In one embodiment, the removable protective layer 130 is constructed as a thin sleeve which fits over the inner walls 114 and outer walls 113 of the extended portions 111 of the insulator 110.

While FIG. 1 shows the removable protective layer 130 extending deep within the cavity 112, the disclosure is not limited to this embodiment. For example, testing may show that the coating on the inner walls 114 does not occur deep into the cavity 112. In these embodiments, the removable protective layer 130 may not extend as deeply along the inner walls 114 as is shown in FIG. 1. Thus, the particular shape of the removable protective layer 130 is not limited by this disclosure and may be determined based on actual or theoretical determinations of coating buildup.

In some embodiments, the removable protective layer 130 is dimensioned such that it can be held in place without any other fastening mechanism. For example, the removable protective layer 130 may be snugly fitted over the extended portions 111 such that friction alone is sufficient to hold it in place against the inner walls 114 and the outer walls 113. In some embodiments, the removable protective layer 130 may be made from a somewhat elastic material to insure a tight fit over the inner walls 114 and outer walls 113. This elastic material may have the same dielectric properties as the component it is being used to cover, such as inner walls 114 and outer walls 113.

Figure 2:
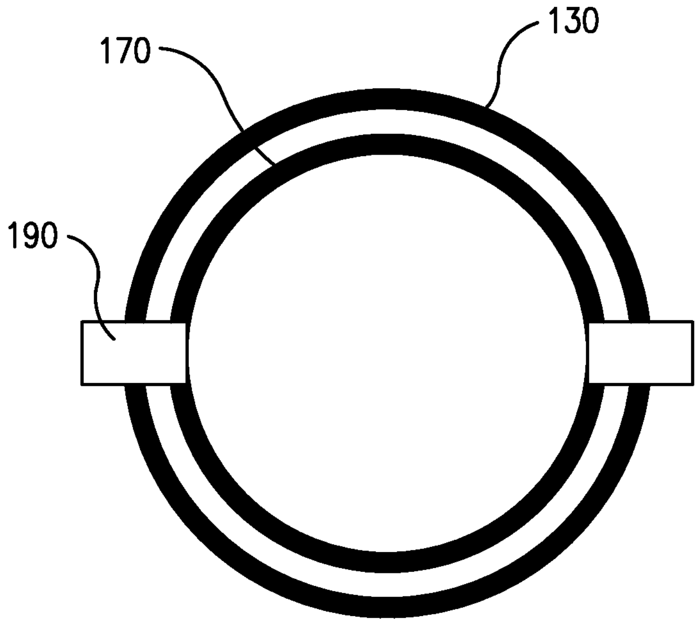
FIG. 2 shows the use of a set screw to hold an insulator in place according to one embodiment.

In other embodiment, the removable layer 130 may be held in place using a fastener such as a clip or set screw. In this embodiment, shown in FIG. 2, the removable protective layer 130 is placed in position over the component 170 to be covered. This component may be, for example, the high voltage feed through insulator 110, shown in FIG. 1, or may be a different type of insulator. One or more fasteners 190 are used to hold the removable layer 130 in place. In some embodiments, two or more fasteners 190 are used, as shown in FIG.

2 to better secure the removable protective layer 130 in place. The set screw or clip may be exposed to ions and therefore may be constructed of a suitable material, such as graphite.

Figure 3:
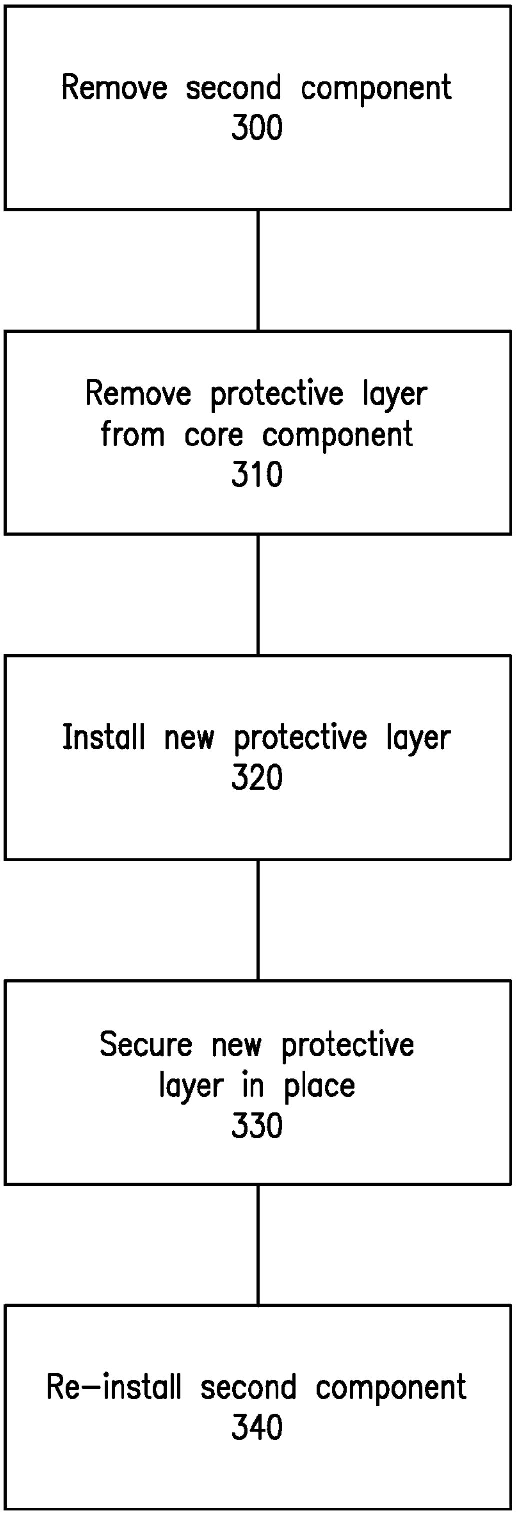
FIG. 3 shows a flowchart of the preventative maintenance process according to one embodiment.

During the PM cycle, the following sequence may be performed, as shown in FIG. 3. The removable protective layer 130 is used to cover an insulating core component, such as high voltage feed through insulator 110. In some cases, as was shown in FIG. 1, the removable protective layer 130 is not easily accessible, due to the presence of a second component, such as an electrode 100 disposed in the high voltage feed through insulator 100. Therefore, first, as shown in step 300, this second component, which may be, for example, electrode 100, may be removed, thereby allowing the removable protective layer 130 to be accessed. In other embodiments, a different type of component may be hindering access to the removable protective layer 130. In these embodiments, this second component may be removed first. Once the removable protective layer 130 is accessible, it is then removed, as shown in step 310. This may be accomplished by prying the protective layer off, if it is attached using only friction. In other embodiments, the protective layer 130 may be removing by removing the fasteners holding it in place. A new removable protective layer 130 is then installed, as shown in step 320. If necessary, the new removable protective layer 130 may be fastened in place, as shown in step 330. The electrode 100 or other second component is then re-installed, as shown in step 340.

The removable protective layer 130 may be made of any suitable material. For example, in some embodiments, the removable layer 130 is made of the same material as the component which it is protecting, such as high voltage feed through insulator 110. For example, alumina may be used to create the insulating core component. In this embodiment, the removable layer 130 may also be made from alumina. In other embodiments, the removable layer 130 may be constructed from a different material. This different material may be selected based on its similarity to the material properties of the underlying component. For example, the different material may be selected based on similar dielectric constant, similar conductivity, similar coefficient of thermal expansion, or other factors. Thus, in some embodiment, removable protective layers may be made of materials such as alumina, boron nitride, Macor®, sesin epoxy and other suitable materials.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A housing, comprising:

a high voltage feed through insulator at least partially disposed in said housing, wherein said high voltage feed through insulator comprises a core insulating material having outer walls and inner walls, wherein said inner walls define a cavity; and a removable protective layer disposed on at least a portion of said outer walls and at least a portion of said inner walls of said core insulating material.

2. The housing of claim 1, further comprising an electrode disposed in said cavity.

3. The housing of claim 1, wherein said removable protective layer is dimensioned such that it is secured to said outer walls and said inner walls with friction.

4. The housing of claim 1, wherein said removable protective layer is secured to said outer walls with a fastener.

5. The housing of claim 1, wherein said removable protective layer comprises an insulating material, selected from the group consisting of alumina, boron nitride and sesin epoxy.

6. The housing of claim 1, wherein said removable protective layer is less than 1/16 inches in thickness.

7. A housing, comprising:

a high voltage feed through insulator at least partially disposed in said housing, wherein said high voltage feed through insulator comprises a core insulating material having an extended portion having outer walls and inner walls, wherein said inner walls define a cavity;

an electrode disposed in said cavity; and a removable protective layer disposed on at least a portion of said outer and inner walls of said extended portion.

8. The housing of claim 7, wherein said removable protective layer is dimensioned such that it is secured to said outer walls and said inner walls with friction.

9. The housing of claim 7, wherein said removable protective layer is secured to said outer walls with a fastener.

10. The housing of claim 7, wherein said removable protective layer comprises an insulating material, selected from the group consisting of alumina, boron nitride and sesin epoxy.

11. The housing of claim 7, wherein said removable protective layer is less than 1/16 inches in thickness.

12. An ion implantation system, comprising:

a housing, through which an ion beam is passed;

a high voltage feed through insulator disposed along a wall of said housing, wherein said high voltage feed through insulator comprises a core insulating material having an outer surface; and a removable protective layer disposed on at least a portion of said outer surface of said core insulating material, such removable protective layer configured to protect said outer surface from exposure to ions in said ion beam.

13. The ion implantation system of claim 12, wherein said high voltage feed through insulator comprises a portion extending outward from said wall of said housing, said portion comprising outer walls and inner walls, wherein said inner walls define a cavity, wherein said outer walls comprise said outer surface and said removable protective layer is disposed on at least a portion of said inner walls.

14. The ion implantation system of claim 13, wherein an electrode is disposed in said cavity.

15. The ion implantation system of claim 13, wherein said removable protective layer is dimensioned such that it is secured to said outer walls and said inner walls with friction.

16. The ion implantation system of claim 12, wherein said removable protective layer is secured to said outer surface with a fastener.

17. The ion implantation system of claim 12, wherein said removable protective layer comprises an insulating material, selected from the group consisting of alumina, boron nitride and sesin epoxy.

18. The ion implantation system of claim 12, wherein said removable protective layer is less than 1/16 inches in thickness.

* * * * *